United States Patent
Okuyama et al.

(10) Patent No.: US 6,717,357 B2
(45) Date of Patent: Apr. 6, 2004

(54) ORGANIC ELECTROLUMINESCENT DISPLAY PANEL

(75) Inventors: Kenichi Okuyama, Yamagata (JP); Kenichi Nagayama, Yamagata (JP); Toru Moriya, Yamagata (JP)

(73) Assignee: Tohoku Pioneer Corporation, Yamagata (JP)

(*) Notice: Subject to any disclaimer, the term of this patent is extended or adjusted under 35 U.S.C. 154(b) by 143 days.

(21) Appl. No.: 09/882,247

(22) Filed: Jun. 18, 2001

(65) Prior Publication Data

US 2001/0054868 A1 Dec. 27, 2001

(30) Foreign Application Priority Data

Jun. 27, 2000 (JP) .................................... P. 2000-192735

(51) Int. Cl.[7] .............................. H05B 33/00; H01J 1/62
(52) U.S. Cl. ..................... 313/504; 313/311; 428/690; 428/212; 428/917; 315/169.3; 359/58; 359/60
(58) Field of Search ................................. 313/504, 311; 428/690, 917, 212; 315/169.3; 359/58, 60

(56) References Cited

U.S. PATENT DOCUMENTS

| 5,936,344 A | * | 8/1999 | Nagayama | .................. 313/504 |
| 6,339,288 B1 | * | 1/2002 | Qian et al. | .................. 313/504 |
| 6,407,408 B1 | * | 6/2002 | Zhou et al. | .................. 313/504 |

* cited by examiner

*Primary Examiner*—Ashok Patel
*Assistant Examiner*—Sharlene Leurig
(74) *Attorney, Agent, or Firm*—Sughrue Mion, PLLC

(57) ABSTRACT

An organic electroluminescent display panel includes a substrate that includes a display panel region having a plurality of organic electroluminescent devices each including a plurality of display electrodes and an organic material layer, which are stacked, and electrically conductive connecting lines electrically connected to electrodes formed in a domain surrounding the display panel region on the substrate. The connecting lines are lower in resistance than the electrodes formed on the display panel region.

6 Claims, 5 Drawing Sheets

ORGANIC ELECTROLUMINESCENT DISPLAY PANEL

BACKGROUND OF THE INVENTION

1. Field of the Invention

The present invention relates to an organic electroluminescent (hereunder abbreviated as EL) display panel that has a plurality of organic EL devices, which are formed on a substrate in a predetermined pattern and each have a light emitting layer constituted by a thin film made of an organic compound material exhibiting electroluminescence that is the emission of light resulting from current injection.

2. Description of the Related Art

Hitherto, there have been organic electroluminescent devices (hereunder referred to as organic EL devices) serving as display devices each using a laminated element made of an organic luminescent material.

An organic EL device is constituted by serially stacking a transparent electrode, an organic EL medium, and a metallic electrode on a transparent substrate. For example, the organic EL medium comprises a single organic light emitting layer, or comprises a three-layer medium having an organic hole transport layer, an organic light emitting layer, and an organic electron transport layer, or comprises a two-layer medium having an organic hole transport layer and an organic light emitting layer, or comprises a laminated medium obtained by inserting an electron or hole injecting layer into between proper ones of such layers.

For example, an organic EL display panel of the matrix display type is constituted by serially stacking line electrodes, which include transparent electrode layer, and organic EL media, and row electrodes including metallic electrode layers each of which intersects with a corresponding line electrode. The line electrodes are each formed like a strip, and arranged at predetermined intervals in such a way as to be parallel with one another. The row electrodes are placed in a similar manner. Thus, the display panel of the matrix display type has an image display arrangement, that is, a display panel region having light emitting pixels respectively constituted by plural organic EL devices that are formed at intersections (referred to as "dots") of plural line electrodes and plural row electrodes.

The organic EL device is of the current injection type. Thus, the luminous efficiency of the device largely depends upon reduction in the resistance of each electrode line. Therefore, when the resistance of each electrode line is high, a large voltage drop is caused by electric current flowing therethrough. Thus, inconsistencies in luminance occur on the panel. Consequently, display quality is degraded.

Thus, there is the necessity for using a low resistance material for wiring of the electrodes in the display panel region on the substrate. However, the conventional organic EL device has a drawback in that especially, the material of the transparent electrode, which serves as an anode and made of indium tin oxide (hereunder referred to as "ITO"), has a high sheet resistance.

Thus, the resistance is reduced by using low-resistance auxiliary metallic lines for wiring between the transparent electrodes (or anodes) in the display panel region. That is, patterned anodes are stacked on the substrate. Moreover, metallic lines are stacked thereon. Thereafter, an organic material layer made of an organic compound, and cathodes are stacked thereon in sequence. Thus, the devices are formed, and moreover, each of the cathodes and the anodes is formed so as to be connected to an external terminal.

However, the reduction in the resistance of the wires, such as connecting lines, provided outside the display panel region on the substrate is not attained.

SUMMARY OF THE INVENTION

The invention is accomplished in view of the aforementioned drawback. Accordingly, an object of the invention is to provide an organic EL device, which can reduce the resistance of electrode wires and realize high display quality, by a process that is easy to perform.

To achieve the above object, according to the invention, there is provided an organic electroluminescent display panel that comprises a substrate including a display panel region having a plurality of organic electroluminescent devices each including a plurality of display electrodes and an organic material layer, which are stacked, and also comprises electrically conductive connecting lines electrically connected to the electrodes formed in a domain surrounding the display panel region on the substrate. The connecting lines are lower in resistance than electrodes formed on the display panel region.

In an embodiment of the organic electroluminescent display panel of the invention, the connecting lines are constituted by electrically conductive thick portions that are thicker in comparison with the electrodes formed on the display panel region.

In an embodiment of the organic electroluminescent display panel of the invention, the surface area of the connecting lines is larger in comparison with that of the electrodes formed on the display panel region.

In an embodiment of the organic electroluminescent display panel of the invention, the connecting lines are made of a material that is lower in resistance in comparison with the material of the electrodes formed on the display panel region.

In an embodiment of the organic electroluminescent display panel of the invention, a total thickness of the connecting lines and the thick portions is larger than the film thickness of the electrode provided on a topmost surface.

In an embodiment of the organic electroluminescent display panel of the invention, the connecting lines are made of the same material as the display electrode provided on a topmost surface. Moreover, the thickness of the connecting lines is nearly equal to the film thickness of the electrode provided on the topmost surface.

In an embodiment of the organic electroluminescent display panel of the invention, the thick portions are made of the same material as the connecting lines.

DETAILED DESCRIPTION OF THE PREFERRED EMBODIMENTS

Hereinafter, an embodiment of the invention is described with reference to the accompanying drawings.

Figure 1:
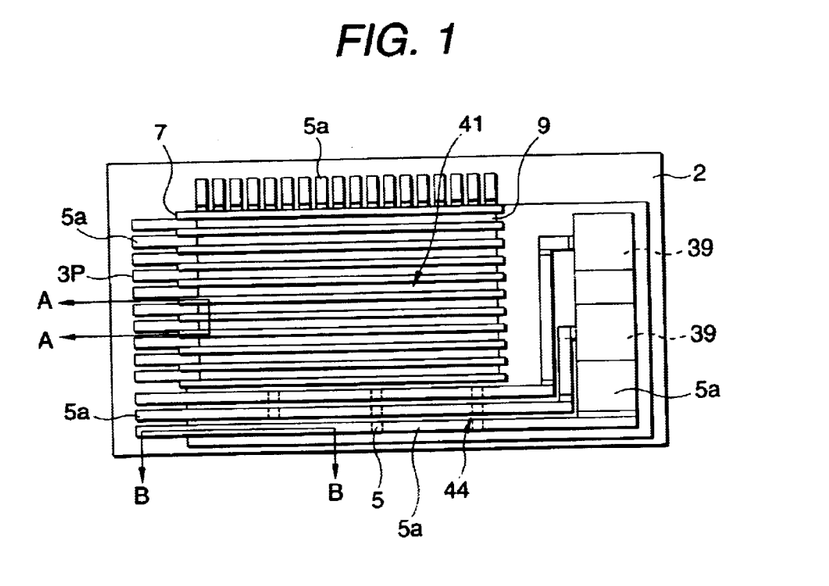
FIG. 1 is a partially enlarged schematic plan view of a multiple chamfered transparent substrate of an embodiment of the invention.

FIG. 1 shows an organic EL display panel 42 that is an embodiment of the invention. This panel includes a display panel region 41 having plural organic EL devices, and a wiring region 44 formed of external terminals and wires which are connected to the organic EL devices.

Figure 2:
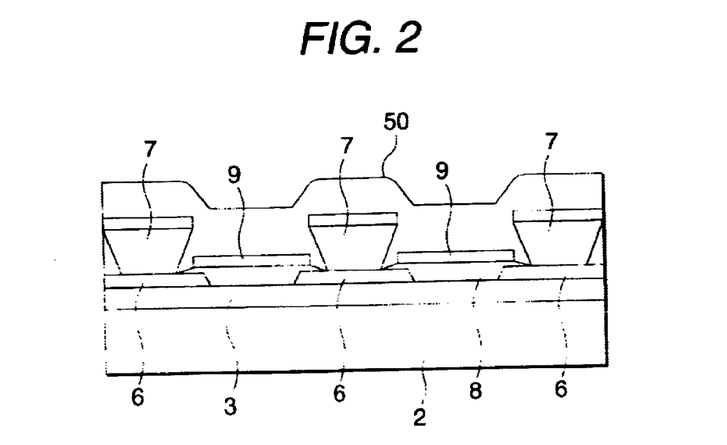
FIG. 2 is a partially enlarged sectional view taken on line A—A of FIG. 1.

The display panel region 41 is an image display arrangement region having plural light emitting pixels arranged in a matrix-like manner on a substrate 2. Each of the light emitting pixels comprises light emitting portions respectively corresponding to red light R, green light G, and blue light B. As shown in FIG. 2, in the display panel region 41, each of the light emitting portions is constituted by an organic EL medium 8 adapted to emitting corresponding color light, which is sandwiched between overlapping portions of a first electrode, which is a transparent anode line 3, and a second electrode, which is a cathode line 9 perpendicular to the first electrode. In a plan view of this figure, the first electrode and the second electrode intersect with each other at the overlapping portion. The adjacent second display electrode lines 9 are electrically separated by a partition 7, which is placed therebetween and formed on an insulating film 6, from each other. A sealing film 50 is formed on the second display electrode lines 9 and the partitions 7.

In the wiring region 44 surrounding the display panel region 41 provided on the substrate 2, each of electrically conductive connecting lines 5 is electrically connected to a corresponding one of the electrodes, as shown in FIG. 1.

Figure 3:
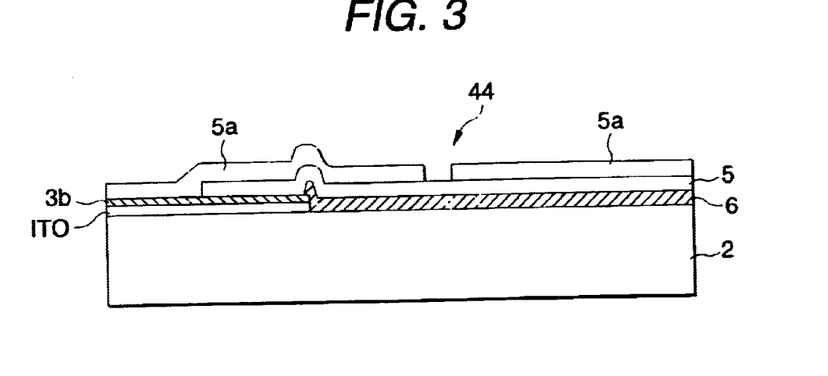
FIG. 3 is a partially enlarged sectional view taken on line B—B of FIG. 1.

As illustrated in FIG. 3, electrically conductive thick portions 5a are formed on the connecting lines 5. A total thickness of the connecting line 5 and the corresponding thick portion 5a is larger than the film thickness of at least the display electrode, that is, a cathode line 9, formed on the topmost surface of the panel. Thus, the sectional area of wires is increased, so that reduction in resistance of the wires is achieved. The connecting lines 5 are made of the same material as the display electrode, that is, the cathode line 9 provided on the topmost surface. The thickness of the connecting lines 5 is nearly equal to the film thickness of the display electrodes. This is because these constituent elements are formed by using the same deposition mask. As shown in FIG. 3, the thick portions 5a are made of the same material as the connecting lines 5, after the lines 5 are formed.

Thus, the reduction in the resistance of the wires is achieved by forming the connecting lines in such a manner as to be constituted by electrically conductive portions that are thicker in comparison with the electrodes formed on the display panel region. Alternatively, the reduction in the resistance of the wires is achieved by forming the connecting lines so that the surface area thereof is larger in comparison with the electrodes formed on the display panel region. Further, alternatively, the effects of reduction in the resistance of the wire are obtained by forming the connecting lines from a material whose resistance is lower in comparison with that of the electrodes formed on the display panel region.

FIGS. 4 to 9 illustrate a process of manufacturing the organic EL display panel according to the embodiment of the invention.

Figure 4:
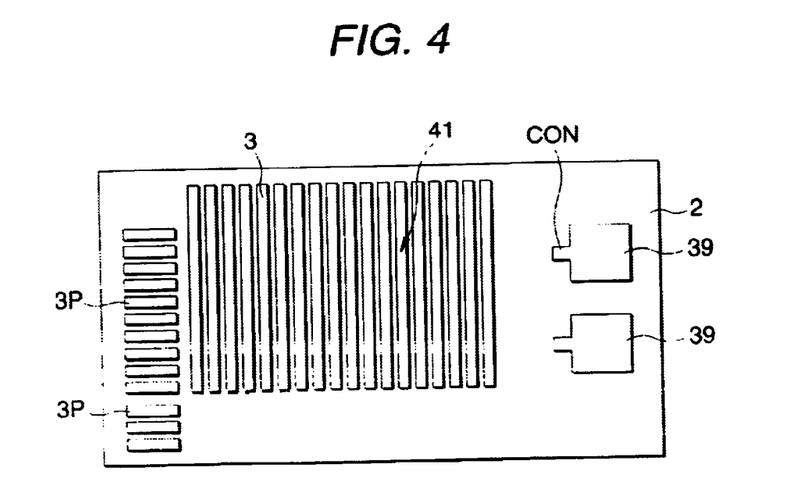
FIG. 4 is a schematic plan view of a substrate in a process of manufacturing an organic EL display panel, which is the embodiment of the invention.

First, as illustrated in FIG. 4, a substrate 2 made of a transmissive material, such as glass, is prepared. A plurality of first electrodes, that is, transparent anodes 3 for the display panel region 41, which are made of ITO and extend parallel to one another, are formed on a principal surface of the substrate 2. Simultaneously, pad portions 3P for external electrode terminal portions outside a display area 39, in which objects, such as icons, are displayed, and outside an image display arrangement area, and for connection of cathodes to be formed later are formed from ITO.

Incidentally, the transparent anodes 3 may be provided by forming connected island-like ITO electrodes in a matrix-like manner so as to form an image display arrangement area, and by evaporating onto the ITO electrodes metallic bus electrodes, which are used for horizontally and electrically connecting the island-like ITO electrodes.

In the case of forming ITO films, connecting portions con (to be described later) for connecting the connecting lines are simultaneously formed. The first display electrodes do not necessarily have the same shape. However, each of the first display electrodes has the connecting portion con (to be described later).

Figure 5:
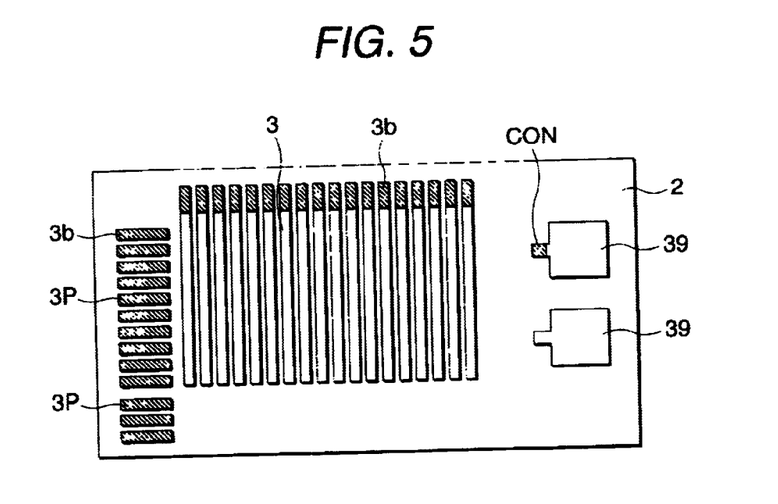
FIG. 5 is a schematic plan view of the substrate in the process of manufacturing the organic EL display panel, which is the embodiment of the invention.

Next, as illustrated in FIG. 5, auxiliary electrodes 3b made of Cr are formed on the connecting portions con of the ITO display areas 39 for displaying objects, such as icons, and on the pad portions 3P for connection of the external electrode terminal portions and of the cathodes, and on anode connecting portions provided at end parts of the transparent anodes 3. These auxiliary electrodes 3b are formed by etching.

Figure 6:
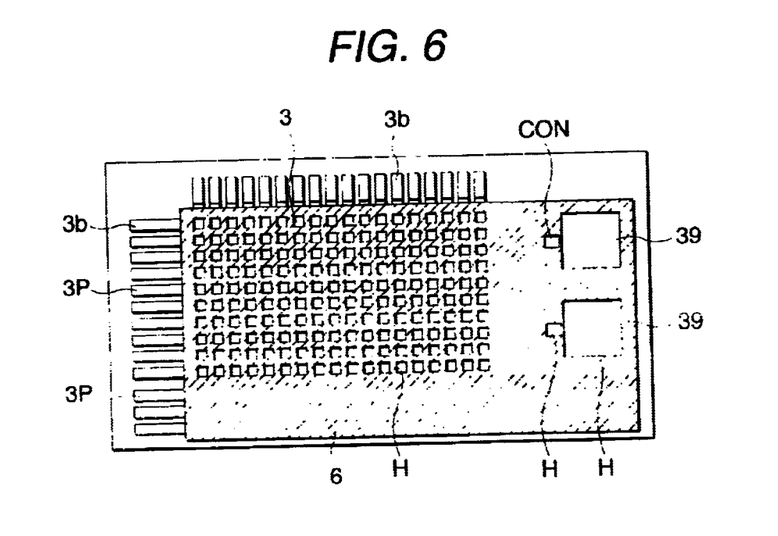
FIG. 6 is a schematic plan view of the substrate in the process of manufacturing the organic EL display panel, which is the embodiment of the invention.

Next, as illustrated in FIG. 6, an insulating layer 6 is formed and stacked on the substrate by using, for instance, a photosensitive resin and $SiO_2$. The insulating layer 6 is formed on the part of the substrate, which is other than through ports having boundaries framing the dot light emitting portions of the device, that is, other than through holes or openings H, so that the first display electrodes 3 and the connecting portions con (to be described later) for connection of the connecting lines are exposed. Similarly, the substrate is coated with an insulating film except the light emitting portions and the connecting portions thereof, such as the icon display areas 39 and the connecting portions thereof, and pad portions 3P for connection of external electrode end portions and of cathode electrodes and anode connecting parts of end portions of the transparent anodes 3 so that such light emitting portions and the connecting portions are exposed.

Figure 7:
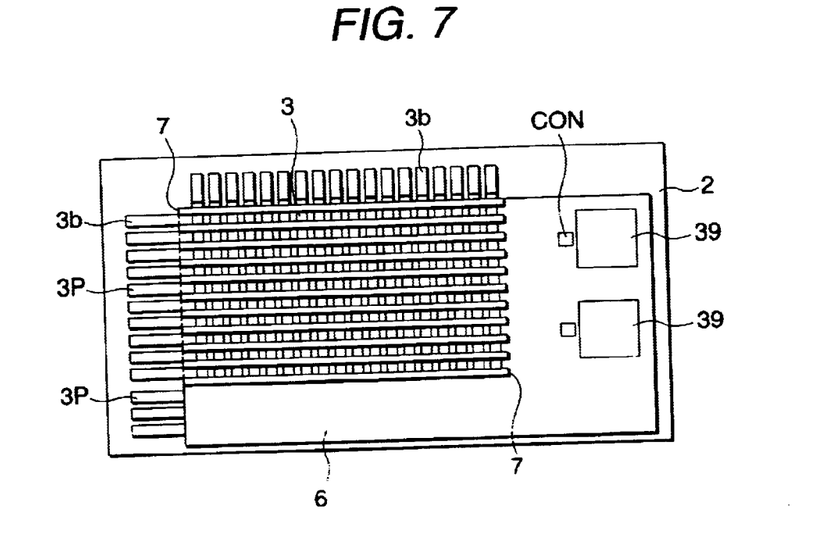
FIG. 7 is a schematic plan view of the substrate in the process of manufacturing the organic EL display panel, which is the embodiment of the invention.

Further, as illustrated in FIG. 7, plural partitions 7, which are made of a photosensitive resin and parallel to one another, are formed so that the cathodes of the second display electrodes 9 are formed at a later step in such a manner as to be separated from one another. That is, plural electrically insulating partitions 7 are formed so that parts corresponding to the dot light emitting portions of the first display electrode 3 are exposed, and that the walls 7 extend in a direction perpendicular to the first electrode and placed at predetermined intervals.

Figure 8:
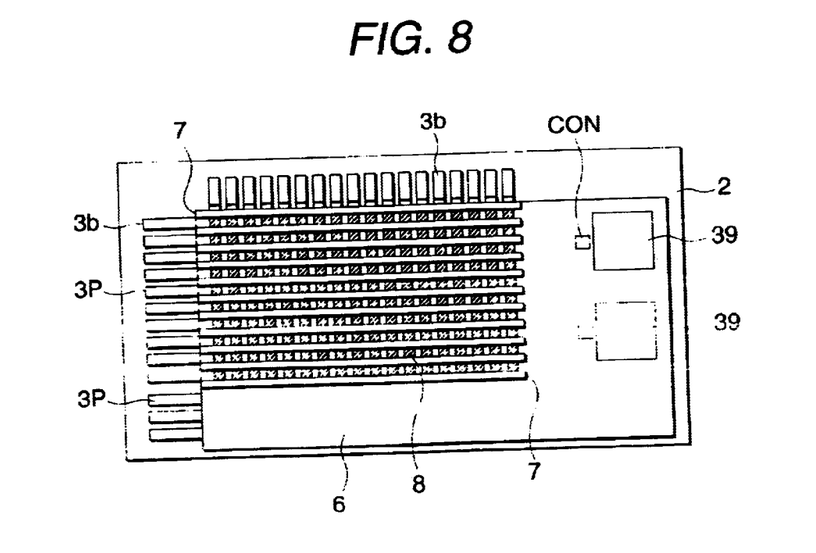
FIG. 8 is a schematic plan view of the substrate in the process of manufacturing the organic EL display panel, which is the embodiment of the invention.

Next, as illustrated in FIG. 8, an organic material layer 8 made of tetraphenyldiamine (TPD) and/or tris-(8- hydroxyquinolinolato)aluminum (Alq$_3$). At that time, the organic material layer 8 may be formed by evaporating the material of the hole transport layer so as to cover at least the entire light emitting area of the device. Needless to say, the organic material layer 8 is formed so as to keep clear of the connecting portions con of the first display electrodes.

Figure 9:
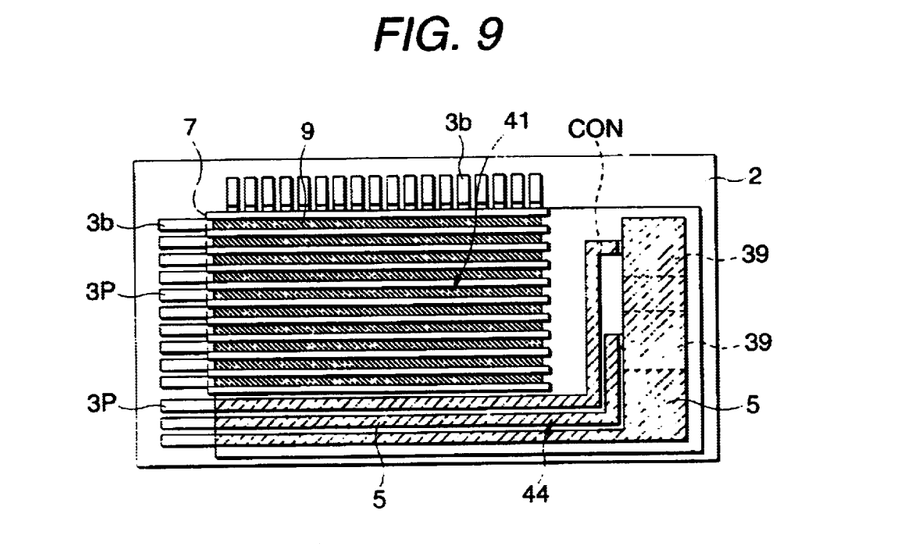
FIG. 9 is a schematic plan view of the substrate in the process of manufacturing the organic EL display panel, which is the embodiment of the invention.

Next, as illustrated in FIG. 9, the second display electrodes (that is, cathodes) 9 and the connecting lines 5 are simultaneously. This is performed as follows. First, for example, Al is employed as the material of the second display electrodes 9 and the connecting lines 5. Then, the second display electrodes 9 made of Al is evaporated onto and stacked on a region, in which the organic material layer 8 is formed, on each of the first display electrodes 3 by evaporating the material using a predetermined mask. Thus, the light emitting display region of the device is formed. Moreover, other portions, onto which Al is evaporated, are formed so as to include the connecting lines 5. In this way, the demarcation of the light emitting portions is performed by the organic material layer at each of the overlapping portions between each of the first display electrodes and a corresponding one of the second display electrodes, each of which has a horizontal section intersecting with that of the first display electrodes. Simultaneously, the demarcation of the wiring area 44 having the external terminals and wires connected to the organic EL device is performed.

Further, in this case, a part of the connecting lines 5 are evaporated onto the connecting portions con that are already formed. Thus, the connecting portions con and the connecting lines 5 are simultaneously and electrically connected to one another.

Next, as illustrated in FIGS. 1 and 3 described above, the evaporation of metal needed still more for wiring is repeated, so that the electrically conductive thick portions 5*a* made of Al are formed on the connecting lines 5. Thus, the connection of wires in the display panel region 41 of the organic EL device is completed. In the case of using a mask having a pattern, in which a mask opening portion for forming the thick portions is large and slits are thin, the strength of a portion thereof in the vicinity of the opening portion is insufficient. Thus, when the thick portions 51 are formed, the plural thick portions are intermittently positioned to thereby eliminate the drawback that the mask is warped. Consequently, a fine wiring pattern is formed.

Finally, after the second display electrodes are formed, a sealing film 50 for preventing moisture from entering the device is formed over the entire region by using an inorganic or organic material. Thus, a full-color organic EL display panel is obtained.

The panel of the invention is constructed as described above. Thus, the reduction in the resistance of connecting lines can be achieved by a simple process. Consequently, an organic EL device display panel enabled to display an image with high display quality and without inconsistencies in the luminance can be realized.

What is claimed is:

1. An organic electroluminescent display panel comprising:
   a substrate including a display panel region having a plurality of organic electroluminescent devices each formed of a plurality of display electrodes and an organic material layer, which are stacked; and
   a plurality of electrically conductive connecting lines electrically connected to said electrodes formed in a domain surrounding the display panel region on said substrate;
   wherein said connecting lines are lower in resistance than said electrodes.

2. The organic electroluminescent display panel according to claim 1, wherein said connecting lines are constituted by electrically conductive thick portions that are thicker than said electrodes.

3. The organic electroluminescent display panel according to claim 1, wherein the surface area of the connecting lines is larger than said electrodes.

4. The organic electroluminescent display panel according to claim 1, wherein said connecting lines are made of a material that is lower in resistance than a material of said electrodes.

5. The organic electroluminescent display panel according to claim 2, wherein a total thickness of said connecting lines and said thick portions is larger than a film thickness of said electrode provided on a topmost surface.

6. The organic electroluminescent display panel according to claim 2, wherein said thick portions are made of the same material as said connecting lines.

* * * * *

UNITED STATES PATENT AND TRADEMARK OFFICE
CERTIFICATE OF CORRECTION

PATENT NO.         : 6,717,357 B2
APPLICATION NO. : 09/882247
DATED                  : April 6, 2004
INVENTOR(S)       : Kenichi Okuyama, Kenichi Nagayama and Toru Moriya It is certified that error appears in the above-identified patent and that said Letters Patent is hereby corrected as shown below:

Claims 1-5 are amended as follows:

1. An organic electroluminescent display panel comprising:
    a substrate including a display panel region having a plurality of organic electroluminescent devices ~~each formed of a plurality of display electrodes and an organic material layer, which are stacked~~;
    first electrodes formed on the substrate;
    an organic material layer formed on the first electrodes;
    second electrodes formed on the organic material layer; and
    a plurality of electrically conductive connecting lines electrically connected to ~~said~~ the second electrodes and formed in a domain surrounding the display panel region on ~~said~~ the substrate;
    wherein each of the organic electroluminescent devices is formed of the first electrodes, the organic material layer and the second electrodes,
    wherein ~~said~~ the electrically conductive connecting lines are lower in resistance than ~~said~~ the second electrodes.

2. The organic electroluminescent display panel according to claim 1, wherein said connecting lines are constituted by electrically conductive thick portions that are thicker than said second electrodes.

3. The organic electroluminescent display panel according to claim 1, wherein the surface area of ~~the~~ an individual connecting ~~lines~~ line is larger than ~~said electrodes~~ that of an individual second electrode.

4. The organic electroluminescent display panel according to claim 1, wherein said connecting lines are made of a material that is lower in resistance than a material of said second electrodes.

UNITED STATES PATENT AND TRADEMARK OFFICE
CERTIFICATE OF CORRECTION

PATENT NO. : 6,717,357 B2
APPLICATION NO. : 09/882247
DATED : April 6, 2004
INVENTOR(S) : Kenichi Okuyama, Kenichi Nagayama and Toru Moriya It is certified that error appears in the above-identified patent and that said Letters Patent is hereby corrected as shown below:

5. The organic electroluminescent display panel according to claim 2, wherein a total thickness of said connecting lines and said thick portions is larger than a film thickness of said <u>second electrodes</u><s>electrode provided on a topmost surface</s>.

Signed and Sealed this

Twenty-second Day of May, 2007

JON W. DUDAS
*Director of the United States Patent and Trademark Office*